(12) United States Patent
Lin

(10) Patent No.: US 7,616,297 B2
(45) Date of Patent: Nov. 10, 2009

(54) DETACHABLE DETECTION WINDOW AND DETECTING SYSTEM

(75) Inventor: Nan-Ying Lin, Miaoli County (TW)

(73) Assignee: United Microelectronics Corp., Hsinchu (TW)

( * ) Notice: Subject to any disclaimer, the term of this patent is extended or adjusted under 35 U.S.C. 154(b) by 160 days.

(21) Appl. No.: 11/693,484

(22) Filed: Mar. 29, 2007

(65) Prior Publication Data

US 2008/0236486 A1   Oct. 2, 2008

(51) Int. Cl.
*G01N 21/00* (2006.01)
(52) U.S. Cl. ........................................... 356/72
(58) Field of Classification Search ................. 356/316, 356/72, 73; 118/712–714; 156/378, 345.15
See application file for complete search history.

(56) References Cited

U.S. PATENT DOCUMENTS 5,748,297 A   5/1998   Suk et al.

2003/0019840 A1 *  1/2003   Smith et al. .................... 216/60

FOREIGN PATENT DOCUMENTS

| CN | 2073524   | 3/1991  |
|----|-----------|---------|
| JP | 09-330917 | 12/1997 |
| JP | 10-209116 | 8/1998  |

* cited by examiner

*Primary Examiner*—Gregory J Toatley, Jr.
*Assistant Examiner*—Abdullahi Nur
(74) *Attorney, Agent, or Firm*—J.C. Patents

(57) ABSTRACT

A detachable detection window suitable for being disposed on a sidewall of a plasma chamber is disclosed. The detachable detection window includes a base and a cannular tube. The base herein has a first linking-up part and a second linking-up part is formed at an end of the cannular tube. The base and the cannular tube are assembled to form the detachable detection window.

19 Claims, 10 Drawing Sheets

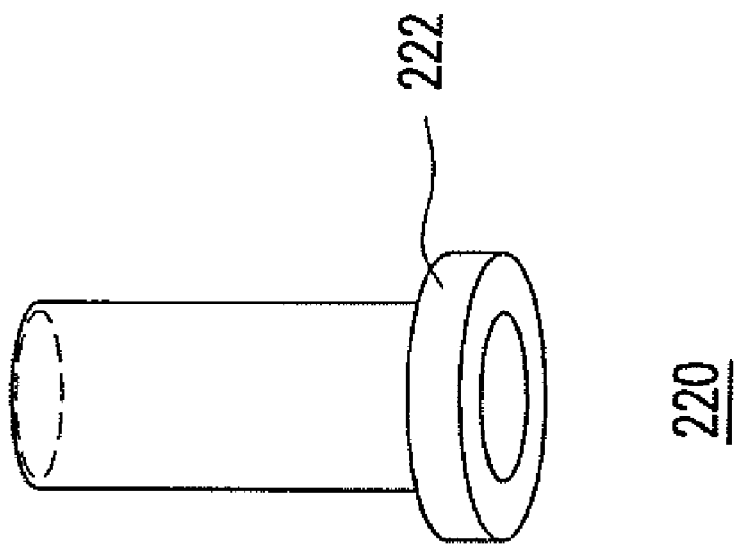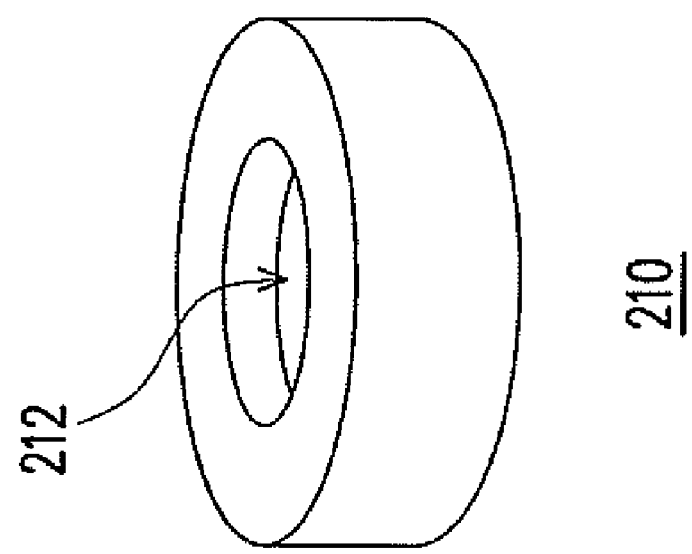
FIG. 2

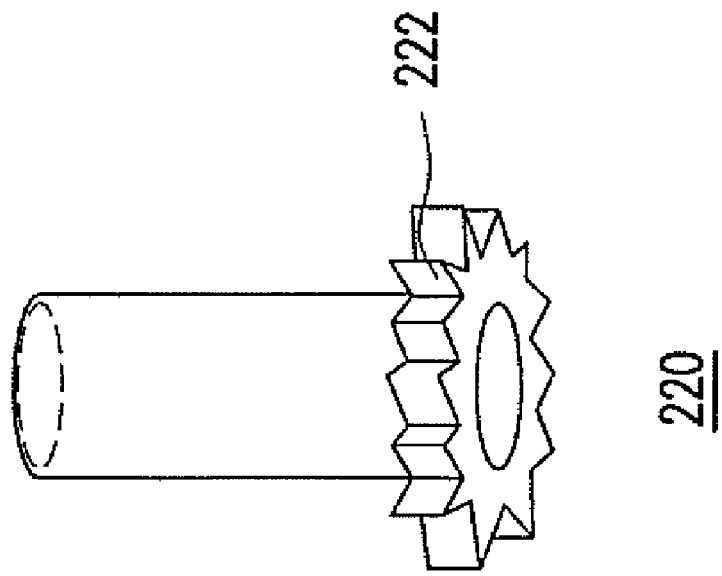
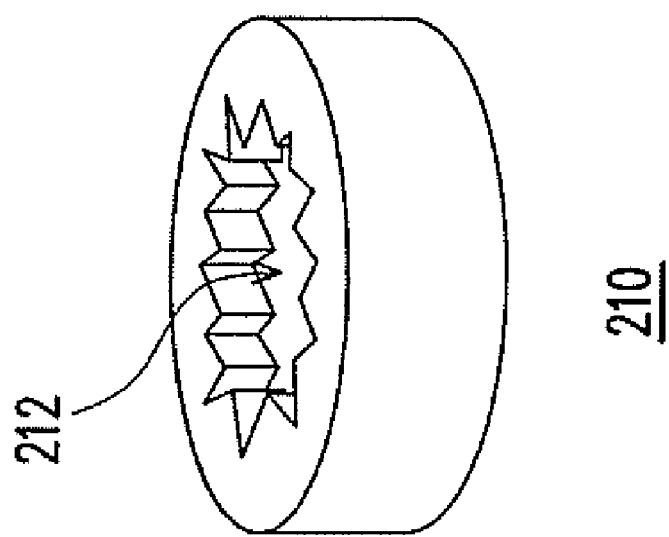
FIG. 4

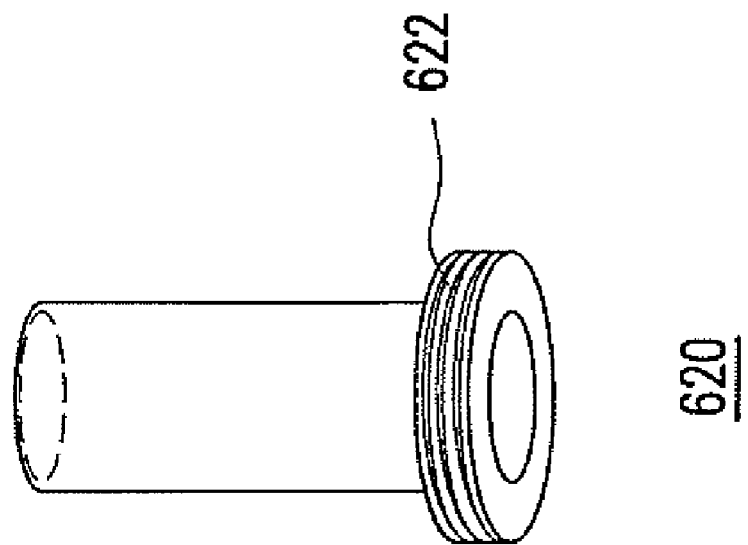
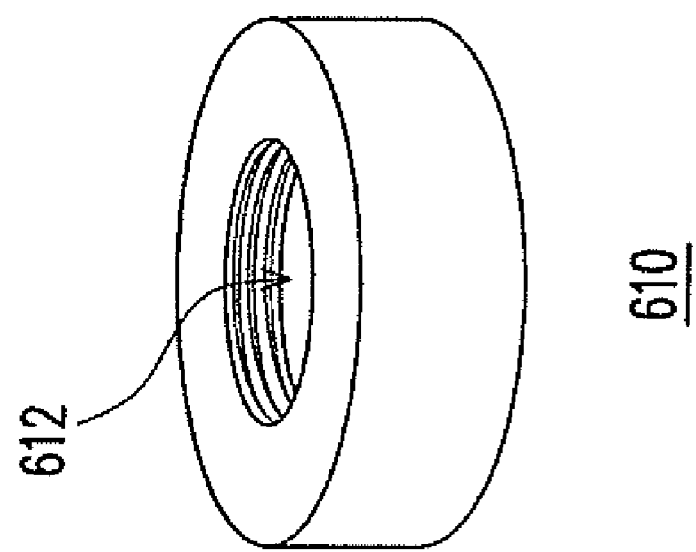
FIG. 6

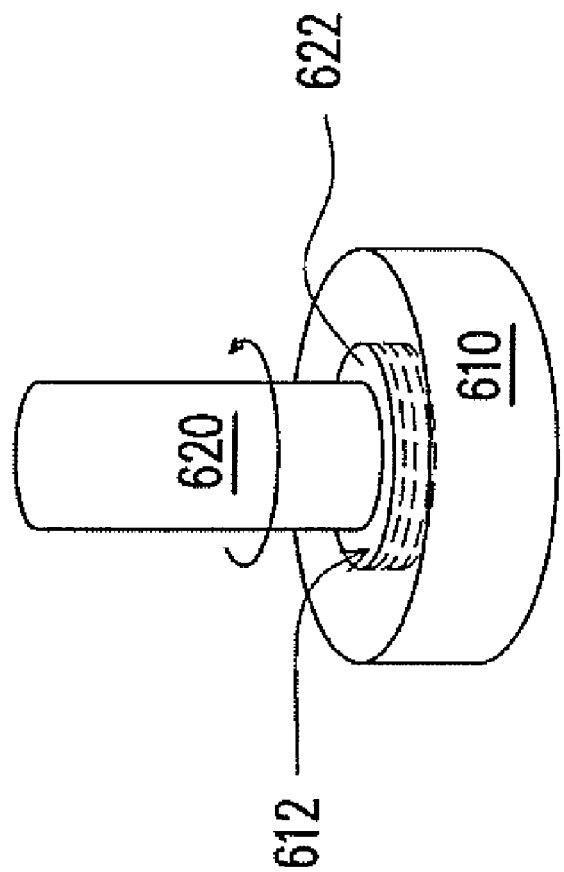
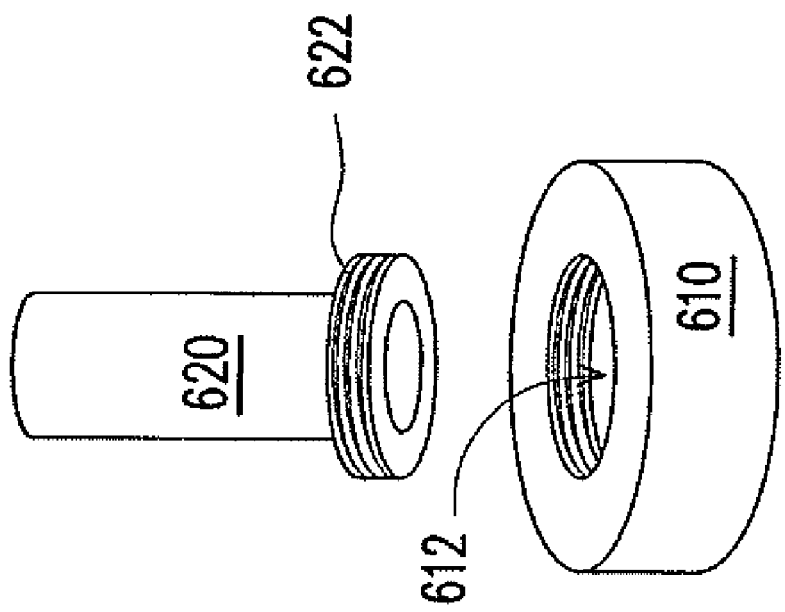
FIG. 7B
FIG. 7A

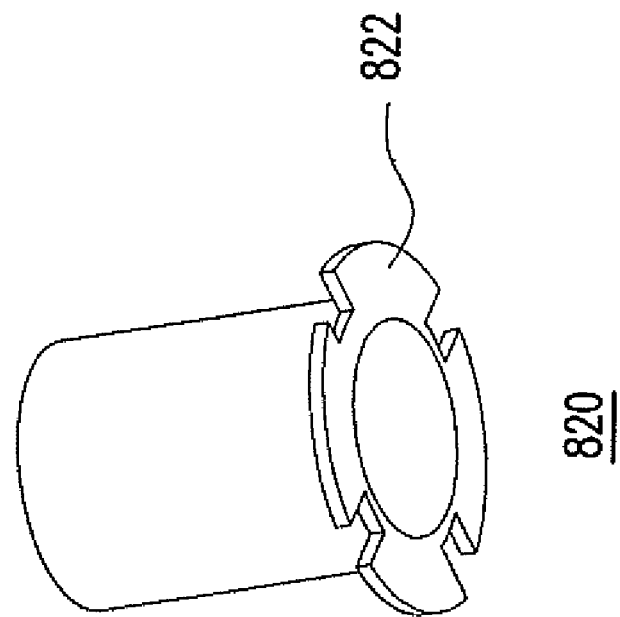
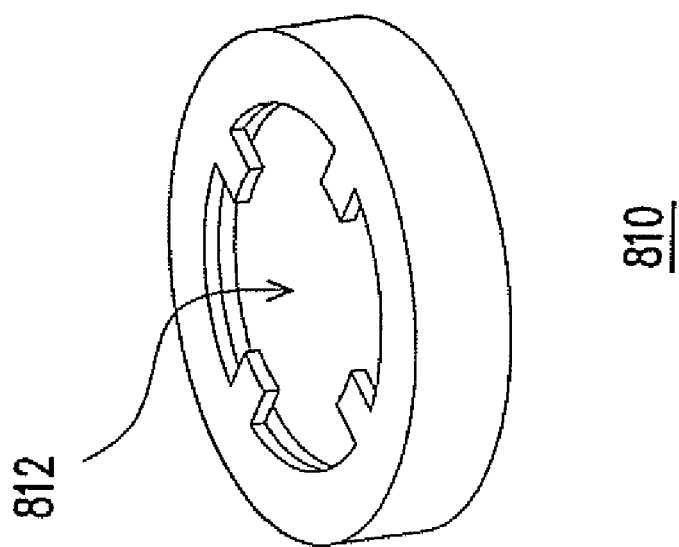
FIG. 8

DETACHABLE DETECTION WINDOW AND DETECTING SYSTEM

BACKGROUND OF THE INVENTION

1. Field of the Invention

The present invention generally relates to a detection apparatus for plasma process, and more particularly, to a detachable detection window and detecting system.

2. Description of Related Art

Currently, integrated circuit (IC) manufacturers have broadly employ plasma technology for carrying out various semiconductor processes, such as deposition of film, etching of film or stripping of photoresist layer. For example, a film deposition may be able to reduce the thermal budget of the process to reduce the fabrication cost. In additionally, an etching of film using the plasma technology can provide a non-isotropic etching process.

Usually, one of problems occurring during the fabrication of wafers in a semiconductor equipment with a plasma chamber is that it is hard to detect whether the plasma has been triggered or ensure the fabrication situation of wafer in the plasma chamber. Thus, it would be highly desirable to equip the plasma chamber with a detecting system to precisely detect the situation in the plasma chamber.

FIG. 1 is a view showing a conventional detection window used in a plasma machine. The detection window 100 in FIG. 1 is one having been used for a certain time already. The detection window 100 is comprised of quartz and has a shape of a barrel container having a base disposed at the bottom portion thereof. Since the detection window 100 is an integrally formed structure formed by using a sintering process; thus, an uneven surface are formed at the bottom portion thereof (an area indicated by the arrow 102), which causes a poor optical transmittance. Other problems associated with the detection window 100 include difficulty to clean detection window 100 and to thoroughly clean the detection window 100. In order to resolve the above-mentioned problems, a chemical solution was proposed, which not only increases the cost, but also corrodes the detection window 100 and also cause chemical traces contamination. When conducting a periodic preventive maintenance (PM) on a machine, it is always found that the detection window is corroded by plasma gas may cause damage or atomization problem. Therefore, after a period of usage, the detection window 100 must be replaced with a new one, which significantly increases the cost.

In addition to the increasing cost, the above-mentioned problems due to uneven bottom surface, chemical trace, corrosion and atomization may cause a misjudgment of an end point detection during a wafer etching process, which would seriously affect the reliability of the process.

SUMMARY OF THE INVENTION

Accordingly, the present invention is directed to a detachable detection window for resolving the problems of the conventional art described above.

The present invention is also directed to a detecting system for detecting an end point of a semiconductor process, which is comparatively more precise and thereby effectively promote the reliability of the semiconductor process.

As embodied and broadly described herein, the present invention provides a detachable detection window suitable for being disposed on a sidewall of a plasma chamber. The detachable detection window includes a base and a cannular tube. The base comprises a first linking-up part and the cannular tube comprises a second linking-up part. The base and the cannular tube are assembled by joining the first linking-up part with the second linking-up part to form the detachable detection window.

According to an embodiment of the present invention, the first linking-up part has a concave shape and the second linking-up part has a corresponding convex shape. The profile of the assembled first linking-up part and the second linking-up part is, for example, circle, ellipse, rectangle, saw-teeth shape, gear or polygon.

According to an embodiment of the present invention, the first linking-up part and second linking-up part respectively have a threaded groove.

According to an embodiment of the present invention, the concave shape of the first linking-up part may be formed by bending parts of the base inward, and when the second linking-up part is placed in the first linking-up part, the second linking-up part is rotated by an angle such that the first linking-up part and the second linking-up part are snapped to each other.

According to an embodiment of the present invention, the cannular tube and that base may be comprised of the same or different material. Both the base and the cannular tube may be comprised of a transparent material.

According to an embodiment of the present invention, the detachable detection window further includes a washer disposed between the cannular tube and the base.

The present invention also provides a detecting system suitably for use in a machine equipped with a plasma chamber. The detecting system at least includes a detachable detection window, a detecting device and an optical fiber tube. The detachable detection window is disposed on a sidewall of a plasma chamber and includes a base and a cannular tube, wherein the base has a first linking-up part and the cannular tube has a second linking-up part at an end thereof. The base and the cannular tube are assembled by joining the first linking-up part with the second linking-up part to form the detachable detection window. In addition, the detecting device is disposed outside of the plasma chamber. An end of the optical fiber tube is connected to the detachable detection window and another end thereof is coupled to the detecting device.

According to an embodiment of the present invention, the first linking-up part has a concave shape and the second linking-up part has a corresponding convex shape. The profile of the assembled first linking-up part and the second linking-up part is, for example, circle, ellipse, rectangle, circular saw, gear or polygon.

According to an embodiment of the present invention, the first linking-up part and second linking-up part respectively have a threaded groove.

According to an embodiment of the present invention, the concave shape of the first linking-up part may be formed by bending parts of the base inward, and when the second linking-up part is placed in the first linking-up part, the second linking-up part is rotated by an angle such that the first linking-up part and the second linking-up part are snapped to each other.

According to an embodiment of the present invention, the cannular tube and the base may be comprised of a same or different material. Both the base and the cannular tube may be comprised of a transparent material.

According to an embodiment of the present invention, the detecting system further includes a washer disposed between the cannular tube and the base. In another embodiment, the detecting system further includes a cover plate disposed on a sidewall of a plasma chamber to cover the detachable detection window.

Since the detection window of the present invention is a detachable detection window, the bottom surface of the detection window is even without a poor optical transmittance problem, and therefore an end point detection of a semiconductor process may be more precisely detected and thereby effectively promote the reliability of the semiconductor process. When a detachable detection window is corroded by plasma gas leading to a damaging or atomizing problem, the damaged components can be easily replaced, and therefore the cost can be significantly reduced. Thus, the problems of cleaning the window may be effectively avoided. On the other hand, the detachable detection window of the present invention nay be suitable for use in an equipment using a plasma system, such as deposing machine, etching machine or photoresist-stripping machine.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2, FIG. 4 and FIG. 5 show exploded views of a detachable detection window according to a first embodiment of the present invention.

FIG. 6 is an exploded view of a detachable detection window according to a second embodiment of the present invention.

FIGS. 7A and 7B are diagrams showing assembly of a detachable detection window according to the second embodiment of the present invention.

FIG. 8 is an exploded view of a detachable detection window according to a third embodiment of the present invention.

DESCRIPTION OF THE EMBODIMENTS

Figure 1:
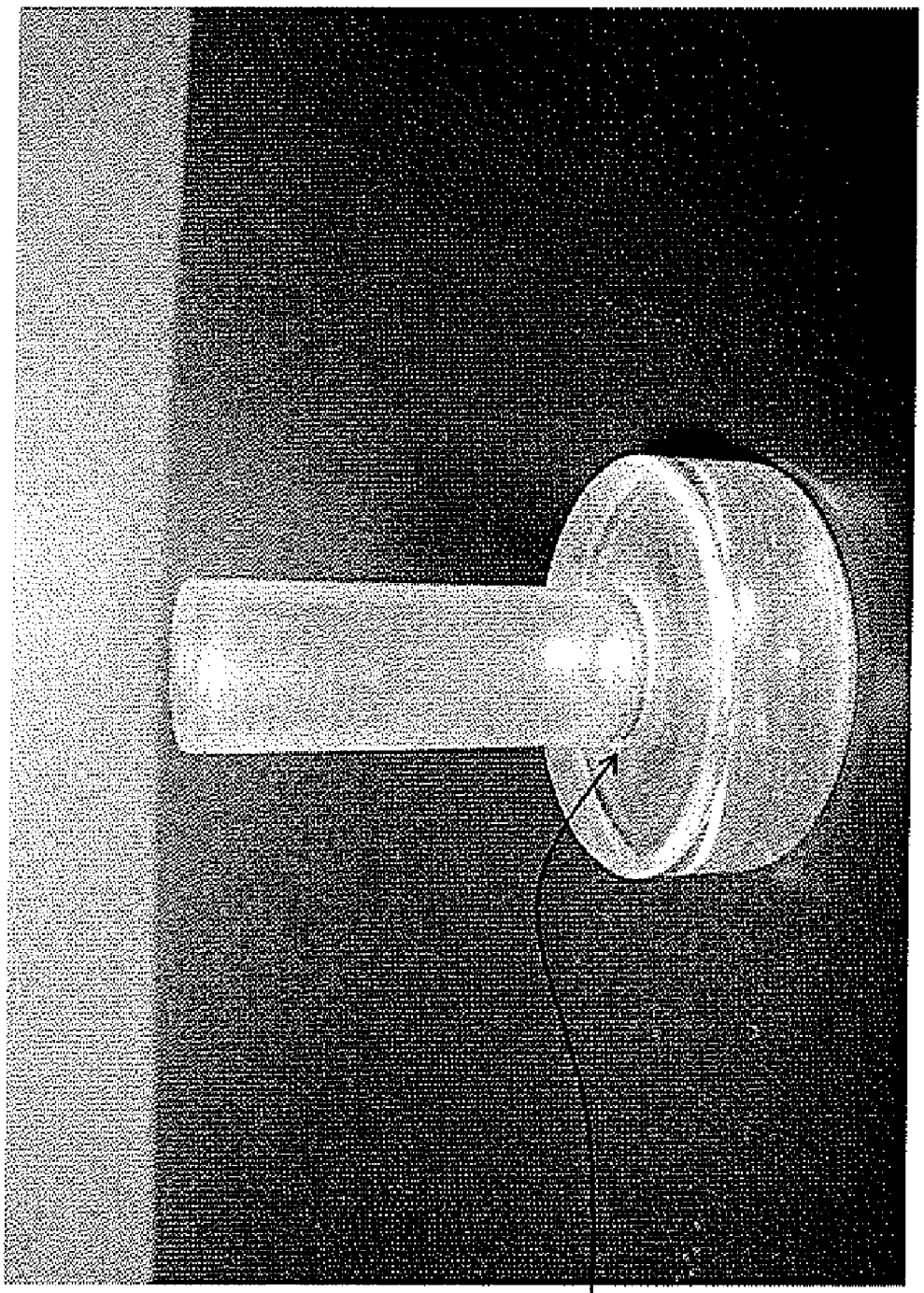
FIG. 1 is a view showing a conventional detection window used in a plasma machine.

Reference will now be made in detail to the present preferred embodiments of the invention, examples of which are illustrated in the accompanying drawings. Wherever possible, the same reference numbers are used in the drawings and the description to refer to the same or like parts.

A conventional detection window integrally formed structure and the joining area may be formed by using sintering process. Based on the situation with the prior art where an uneven bottom surface of a conventional detection window occurs, the window is hard to be cleaned and requires a higher cost for replacing, and a wrong judgment affecting the process reliability would be made during an end point detection procedure with a wafer etching process, present invention provides a detachable detection window in order to solve the above-mentioned problems with the prior art. The detachable detection window of the present invention is suitably disposed on a sidewall of the plasma chamber of an equipment using a plasma system, such as a deposing machine, an etching machine or a photoresist-stripping machine.

In the following, several embodiments are described to explain the detachable detection window of the present invention.

The First Embodiment

FIG. 2 is an exploded view of a detachable detection window according to a first embodiment of the present invention.

Referring to FIG. 2, the detachable detection window of the present embodiment includes a base 210 and a cannular tube 220. The base 210 has a first linking-up part 212 having, for example, a concave shape. The base 210 may be comprised of a transparent material, for example, glass, quartz, acrylic or the like. A second linking-up part 222 may be formed at an end of the cannular tube 220 having, for example, a convex shape corresponding to the first linking-up part 212. The cannular tube 220 and the base 210 may be comprised of a same or different material. The cannular tube 220 may be comprised of a transparent material, for example, glass, quartz, acrylic or the like.

Figure 5:
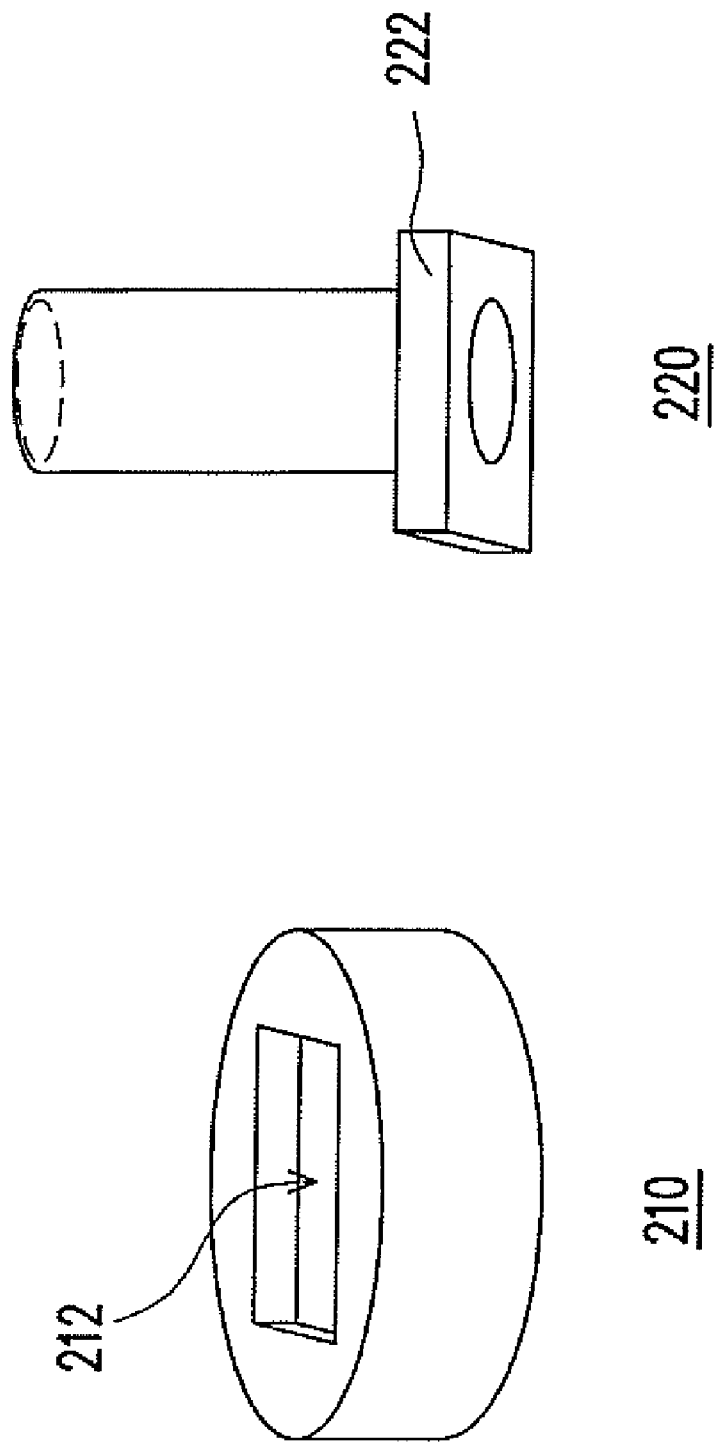
Figure 9:
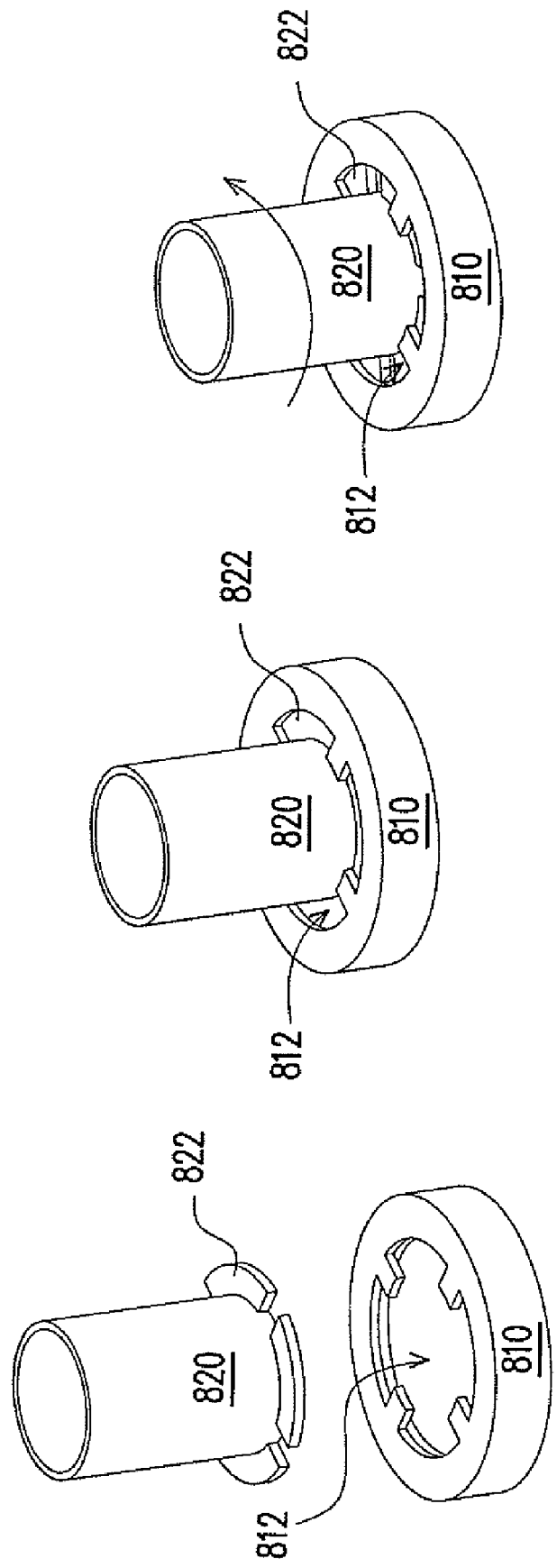
FIGS. 9A-9C are diagrams showing assembly of a detachable detection window according to the third embodiment of the present invention.

The present invention does not limit the shape of the first linking-up part 212 and the second linking-up part 222 as such. In other embodiments, the first linking-up part 212 and the second linking-up part 222 may have, for example, sawteeth shape (as shown by FIG. 4), rectangular shape (as shown by FIG. 5), ellipsoidal shape (not shown), gear shape (not shown) or other polygonal shape (not shown). Besides, the first linking-up part 212 and the second linking-up part 222 may also have, for example, circular shape, ellipsoidal shape, rectangular shape or polygonal, all of which respectively have a wave-like edge or a plurality of wave-like edges.

The detachable detection window of the present embodiment can further include a seal (not shown) disposed between the base 210 and the cannular tube 220. The seal may be used to secure the base 210 to the cannular tube 220.

Figure 3B:
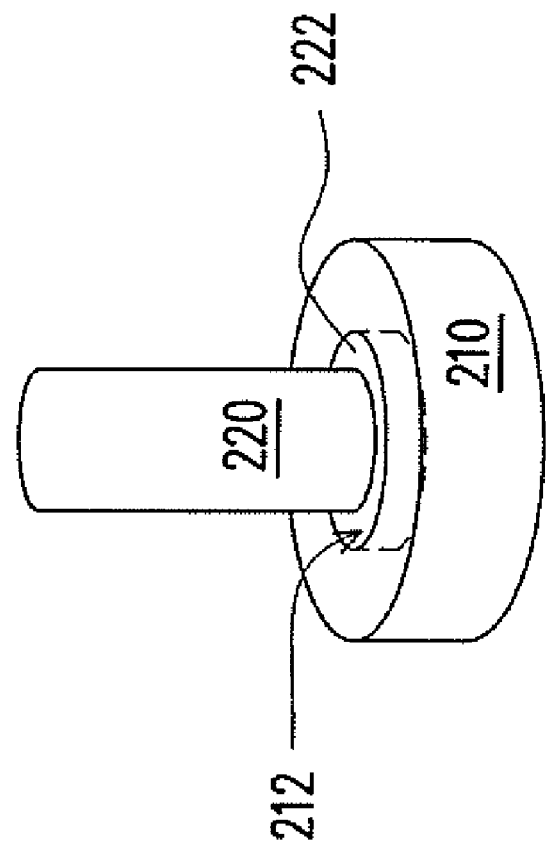
FIGS. 3A and 3B are diagrams showing the assembly of a detachable detection window according to the first embodiment of the present invention.
Figure 3A:
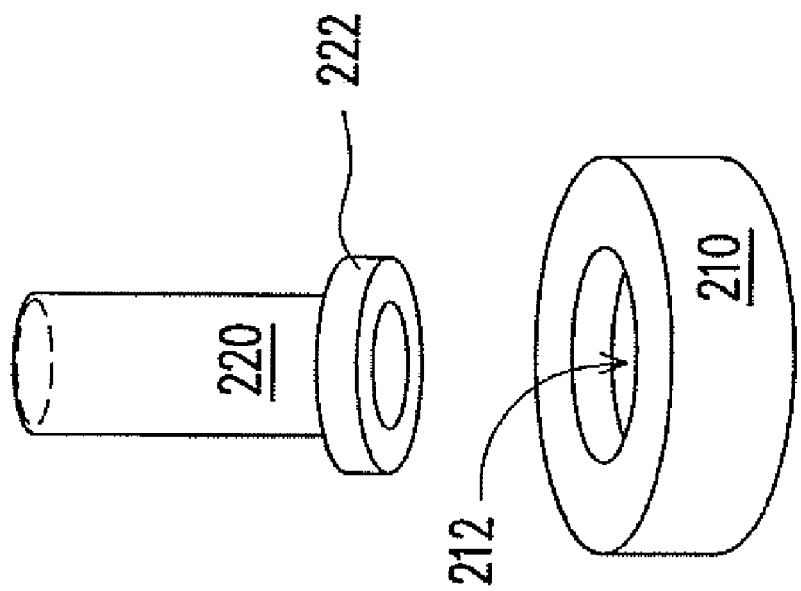

FIGS. 3A and 3B are views showing the assembling of the detachable detection window according to the first embodiment of the present invention. The first linking-up part 212 of the base 210 has a circle concave shape and the second linking-up part 222 of the cannular tube 220 has a corresponding circle convex shape. As shown by FIG. 3A, first, the second linking-up part 222 of the cannular tube 220 is placed over the first linking-up part 212 of the base 210. Next, the second linking-up part 222 of the cannular tube 220 is directly embedded into the first linking-up part 212 of the base 210 so as to assemble a detection window. To clean the detection window, the base 210 is directly separated from the cannular tube 220, the detachable detection window of the present embodiment can be disassembled.

A particular remark herein is that since the joining area of the detachable detection window according to the present embodiment is a flat surface, thus, there is no poor optical transmittance problem as the prior art at all. The poor optical transmittance in the prior art would cause a wrong judgment during an end point detection procedure with a wafer etching process, which would affect the reliability of the process.

Since the detachable detection window of the present embodiment can be easily assembled and disassembled, and therefore it is easy to clean the detachable detection window. In addition, since the detachable detection window of the embodiment does not require additional chemical solution for cleaning, and therefore not only the cost is reduced but also the problems corrosion, contamination of chemical trace and a possible wrong judgment of an end point detection of a wafer etching process may also be effectively avoided.

On the other hand, when the detachable detection window is corroded by plasma gas, only the damaged components may be replaced, and therefore, the fabrication cost may be effectively reduced.

The Second Embodiment

FIG. 6 is an exploded view of a detachable detection window according to a second embodiment of the present invention.

Referring to FIG. 6, the detachable detection window of the present embodiment is similar to the first embodiment except for the base 610 and the cannular tube 620 respectively have a threaded groove to tighten the base to the cannular tube.

The base 610 of the detachable detection window in the second embodiment has a first linking-up part 612 having, for example, a concave shape and the internal peripheral surface of the concave portion has a threaded groove. The base 610 is comprised of a transparent material, for example, glass, quartz, acrylic or the like. A second linking-up part 622 having a thread groove is formed at end of the cannular tube 620. The second linking-up part 622 has, for example, a convex shape corresponding to the first linking-up part 612 and the external peripheral surface of the convex portion has a threaded groove. The cannular tube 620 and the base 610 may be comprised of the same as or different material. The cannular tube 620 is comprised a transparent material, for example, glass, quartz, acrylic or the like.

According to an embodiment of the present embodiment, a seal (not shown) may be disposed between the base 610 and the cannular tube 620 securely fitting the base 610 to the cannular tube 620.

FIGS. 7A and 7B are showing the assembling of the detachable detection window according to the second embodiment of the present invention. First, the second linking-up part 622 of the cannular tube 620 is placed over the first linking-up part 612 of the base 610. Next, the cannular tube 620 is turned into the base 610 to assemble the detection window. In order to clean the detection window, the cannular tube 620 is turned away from the base 610, the detachable detection window of the present embodiment is disassembled.

The Third Embodiment

FIG. 8 is an exploded view of a detachable detection window according to a third embodiment of the present invention.

Referring to FIG. 8, the detachable detection window includes a base 810 and a cannular tube 820. The base 810 has a first linking-up part 812 having a concave shape formed by bending parts of the base 810 inward. The base 810 may be comprised of a transparent material, for example, glass, quartz, acrylic or the like. A second linking-up part 822 may be formed at end of the cannular tube 820. When the second linking-up part 822 is placed into the first linking-up part, the second linking-up part 822 is rotated at an angle relative to the first linking-up part 812 such that the first linking-up part 812 and the second linking-up part 822 snap to each other. The cannular tube 820 and the base 810 may be comprised of the same as or different material. The cannular tube 820 is comprised of a transparent material, for example, glass, quartz, acrylic or the like.

In the present embodiment, the first linking-up part 812 and the second linking-up part 822 shown by FIG. 8 are used as an example to describe how they are joined with each other. Those skilled in the art however would easily deduce the other assembly means to join the base 810 with the cannular tube 820.

The detachable detection window of the present embodiment may include a seal (not shown) disposed between the base 810 and the cannular tube 820 securely fitting the base 810 with the cannular tube 820.

9A-9C are diagrams showing the assembly of a detachable detection window according to a third embodiment of the present invention. First, the second linking-up part 822 of the cannular tube 820 is placed in the first linking-up part 812 of the base 810. Next, the cannular tube 820 is rotated by an angle and the first linking-up part 812 and the second linking-up part 822 snap each other to complete the assembly of the detection window. During the cleaning process, the cannular tube 820 is turned by an angle and removed, so as to disassemble the detachable detection window.

Although in the above-mentioned embodiments, the base and the cannular tube of the detachable detection window have a circular profile, however the present invention does not limit the scope of the present invention as such. Those skilled in the art would understand that the base and the cannular tube can have an easy-to-make geometric profile, such as rectangular, pentagonal or hexagonal.

In the following, the application of the detachable detection window provided by the present invention in an equipment using a plasma system, such as in deposing machine, etching machine or photoresist-removing machine is exemplarily explained.

Figure 10:
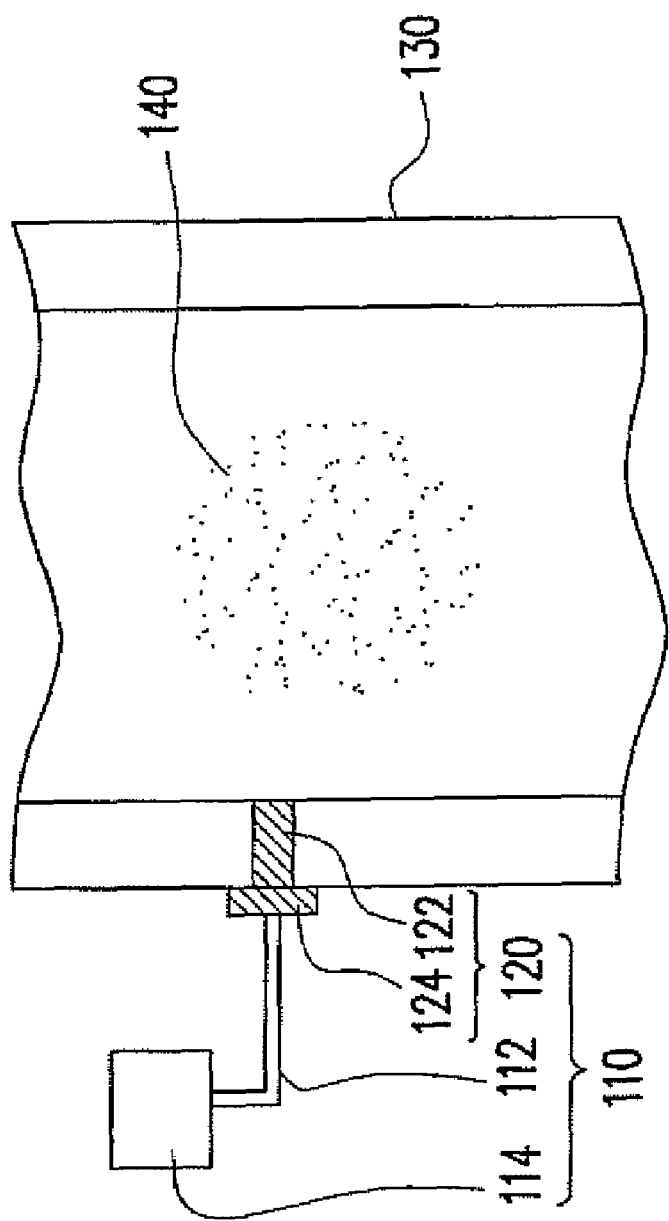
FIG. 10 is view showing a configuration of a detecting system disposed on a plasma chamber according to an embodiment of the present invention.

FIG. 10 is a view showing a configuration of a detecting system disposed on a plasma chamber according to an embodiment of the present invention.

Referring to FIG. 10, a plasma chamber 130 can be equipped with at least a detecting system 110 for monitoring the internal status of the plasma chamber 130. The detecting system 110 includes at least a detachable detection window 120, a detecting device 114 and an optical fiber tube 112. The detachable detection window 120 is disposed on a sidewall of the plasma chamber 130. The detachable detection window 120 includes a base 124 and a cannular tube 122, and the detachable detection window 120 is identical to that of the first embodiment, second embodiment and third embodiment. The detecting device 114 is, for example, a computer and other relative equipments disposed external to the plasma chamber 130. An end of the optical fiber tube 112 is connected to the detachable detection window 120 and another end thereof is coupled to the detecting device 114.

According to an embodiment of the present invention, a seal (not shown) may be disposed between the base 124 and the cannular tube 122 to securely fit the base 124 to the cannular tube 122. In another embodiment, the detecting system 110 may include a cover plate (not shown). The cover plate is disposed on a sidewall of the plasma chamber 130 and covers the detachable detection window 120. The cover plate is employed for protecting the detachable detection window 120.

Hereinafter, the operation of the detecting system 130 is described. When the plasma 140 is triggered during a plasma process, the light generated by the plasma would be detected and this data received through the detachable detection window 120 and the optical fiber tube 112. The data then is transmitted to the detecting device 114 for a signal analysis, so that the object of monitoring the internal status of the plasma chamber 130 can be achieved.

Since the joining area of the detachable detection window 120 has an even surface, therefore, poor optical transmittance problem as in the case of the conventional art may be effectively reduced. Thus, a more precise detection of the internal status of the plasma chamber 130 may be effectively achieved.

In summary, the present invention has at least the following advantages:

1. Since the detection window of the present invention has a even surface joining area, and therefore poor optical transmittance problem as in the case of the prior art may be effectively reduced. Thus, a more precise detection of the internal status of a plasma chamber may be effectively achieved.

2. Since the detachable detection window of the present embodiment can be easily assembled and disassembled, and therefore it can be easily cleaned. In addition, no special cleaning solution is required to clean the detachable detection window.

3. When a detachable detection window is corroded, only the damaged components needs to be replaced, and therefore the cost can be effectively reduced.

4. The detachable detection window of the present invention can be used in an equipment employing a plasma system, such as in deposing machine, etching machine or photoresist-removing machine.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A detachable detection window, suitable for being disposed on a sidewall of a plasma chamber, comprising:
    a base, disposed external to the plasma chamber and having a first linking-up part; and
    a cannular tube, embedded in the sidewall of the plasma chamber and having a second linking-up part formed at an end thereof;
    wherein the base and the cannular tube are assembled to form the detachable detection window.

2. The detachable detection window according to claim 1, wherein the first linking-up part has a concave shape, and the second linking-up part has a convex shape corresponding to the first linking-up part.

3. The detachable detection window according to claim 2, wherein a profile of the assembled first linking-up part and the second linking-up part comprises circle, ellipse, rectangle, saw-teeth shape, gear or polygon.

4. The detachable detection window according to claim 1, wherein the first linking-up part and the second linking-up part respectively have a threaded groove.

5. The detachable detection window according to claim 1, wherein the first linking-up part has a concave shape with bending parts, and the second linking-up part has a convex shape corresponding to the concave shape and lodged under the bending parts.

6. The detachable detection window according to claim 1, wherein the base comprises a transparent material.

7. The detachable detection window according to claim 1, wherein the cannular tube comprises a transparent material.

8. The detachable detection window according to claim 1, wherein the cannular tube and the base comprise the same or different material.

9. The detachable detection window according to claim 1, further comprising a seal disposed between the cannular tube and the base.

10. A detecting system, suitable for use in a machine equipped with a plasma chamber, comprising:
    a detachable detection window, disposed on a sidewall of the plasma chamber, comprising;
        a base, disposed external to the plasma chamber and having a first linking-up part; and
        a cannular tube, embedded in the sidewall of the plasma chamber and having a second linking-up part formed at an end thereof;
        wherein the base and the cannular tube are assembled to form the detachable detection window;
    a detecting device, disposed external to the plasma chamber; and
    an optical fiber tube, wherein an end of the optical fiber tube is connected to the base and another end thereof is coupled to the detecting device.

11. The detecting system according to claim 10, wherein the first linking-up part has a concave shape and the second linking-up part has a convex shape corresponding to the first linking-up part.

12. The detecting system according to claim 11, wherein a profile of the assembled first linking-up part and the second linking-up part comprises circle, ellipse, rectangle, saw-teeth shape, gear or polygon.

13. The detecting system according to claim 10, wherein the first linking-up part and the second linking-up part respectively have a threaded groove.

14. The detecting system according to claim 10, wherein the first linking-up part has a concave shape with bending parts, and the second linking-up part has a convex shape corresponding to the concave shape and lodged under the bending parts.

15. The detecting system according to claim 10, wherein the base comprises a transparent material.

16. The detecting system according to claim 10, wherein the cannular tube comprises a transparent material.

17. The detecting system according to claim 10, wherein the cannular tube and the base comprises the same or different material.

18. The detecting system according to claim 10, further comprising a seal disposed between the cannular tube and the base.

19. The detecting system according to claim 10, further comprising a cover plate disposed on a sidewall of the plasma chamber covering the detachable detection window.

* * * * *